(12) United States Patent
Park

(10) Patent No.: US 8,111,568 B2
(45) Date of Patent: Feb. 7, 2012

(54) SEMICONDUCTOR MEMORY DEVICE HAVING BIT TEST CIRCUIT WITH IGNORE FUNCTION

(75) Inventor: Il-Sang Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 242 days.

(21) Appl. No.: 12/458,080

(22) Filed: Jun. 30, 2009

(65) Prior Publication Data

US 2010/0054061 A1    Mar. 4, 2010

(30) Foreign Application Priority Data

Aug. 26, 2008  (KR) .................. 10-2008-0083217

(51) Int. Cl.
*G11C 7/00*    (2006.01)
(52) U.S. Cl. ...................................... 365/201
(58) Field of Classification Search ............ 365/201
See application file for complete search history.

(56) References Cited

U.S. PATENT DOCUMENTS

2008/0022170 A1* 1/2008 Byun et al. ............... 714/724

FOREIGN PATENT DOCUMENTS

| JP | 2001-57100 | 2/2001 |
| KR | 10-2003-0052509 | 6/2003 |
| KR | 10-2003-0067891 | 8/2003 |

* cited by examiner

*Primary Examiner* — Hoai V Ho
*Assistant Examiner* — Anthan Tran
(74) *Attorney, Agent, or Firm* — Harness, Dickey & Pierce, P.L.C.

(57) ABSTRACT

A semiconductor memory device including a bit test circuit with an ignore function is provided. The semiconductor memory device includes a memory cell array and a bit test circuit. The memory cell array includes a plurality of memory cells. The bit test circuit is configured to perform a parallel bit test to determine defective memory cells based on bits received from the plurality of memory cells, a tester signal for each of the plurality of memory cells, and a mode register set signal for each of the plurality of memory cells. The bit test circuit is also configured to output a non-defective pass signal for at least one of the plurality of memory cells based on at least one of the at least one bit received from the at least one memory cell, the tester signal for the at least one memory cell and the mode register set signal for the at least one memory cell.

8 Claims, 13 Drawing Sheets

CONVENTIONAL ART

CONVENTIONAL ART

SEMICONDUCTOR MEMORY DEVICE HAVING BIT TEST CIRCUIT WITH IGNORE FUNCTION

CROSS-REFERENCE TO RELATED APPLICATIONS

This application claims priority under 35 U.S.C. §119 to Korean Patent Application 10-2008-0083217, filed on Aug. 26, 2008 in the Korean Intellectual Property Office, the entire contents of which are hereby incorporated by reference.

BACKGROUND

In general, a conventional semiconductor memory device such as a dynamic random access memory (DRAM) is becoming faster and more integrated according to a user's requirements. A DRAM may include an access transistor and a storage capacitor as a unit memory cell. The conventional DRAM is generally employed as a main memory device in an electronic system.

For example, when memory cells integrated in a memory cell array region have a defect, the defective memory cell or cells cannot serve as a storage device in a read or write operation. Furthermore, manufacturing all memory cells designed through semiconductor manufacturing processes without defects may be difficult. Therefore, manufacturers of semiconductors install redundancy memory cells besides normal memory cells so that defective cells may be replaced with redundancy memory cells when normal memory cells are defective.

To obtain a redundancy scheme, a test such as a parallel bit test or multibit test may be used to decide which cell has a defect among normal memory cells.

The parallel bit test may be performed in an electrical die sorting (EDS) process, in which a shortened test time is preferred. Therefore, the parallel bit test may used instead of a serial bit test. A parallel bit test (PBT) of related art and an enhanced parallel bit test (ePBT) are described referring to FIGS. 1 to 5.

A general DRAM employs a parallel bit test circuit to perform a parallel test of a plurality of bits. In a parallel bit test mode, same data are written to N memory cells, N being a natural number of 2 or more, and then data of N bits are simultaneously read. The read data of N bits are compared to each other by a comparator. An output from the comparator indicates whether the bits are equal (e.g., "pass") or are unequal (e.g., "fail"). Depending on the equal or unequal result, a "1"/"0" is output as test result data. In the parallel bit test mode, the number of cycles to test all bits is reduced to 1/N and thus the test time can be shortened.

FIG. 1 illustrates a test block for a semiconductor memory device. In a configuration of FIG. 1, an input mode selector 100 transfers input data DI to a plurality of cell arrays 200 by selecting one of a normal mode and a test mode. In the normal mode, the input mode selector 100 transfers the input data D1 to one of the plurality of cell arrays 200. In the test mode, the input mode selector 100 transfers the input data D1 to all of the plurality of cell arrays 200. The plurality of cell arrays 200 stores the input data and output data to a comparator 300. The comparator 300 generates a comparison output signal com_out by comparing outputs of the plurality of cell arrays 200. An output mode selector 400 selects a mode (e.g., test or normal) in an output terminal and outputs a test result or data DQ to the outside according to the selected mode. For example, if the normal mode is selected, an output from one of the plurality of cell arrays 200 is selected.

In a normal mode of FIG. 1, one word line and bit lines corresponding to the number of input/output bits within one of the plurality of cell arrays 200 are selected through a combination of a row address and a column address to access a cell in the same scheme as an operation of general memory. Therefore, data of cells are written or read.

In a parallel bit test mode, the input mode selector 100 selects the test mode and the same data is written to the plurality of cell arrays 200. Data that is output from each of the plurality of cell arrays 200 are applied to the comparator 300 through a sense amplifier in a read operation for the test. When the data output from each of the plurality of cell arrays 200 are all 'low' or all 'high', the output com_out of the comparator is a 'low' level. When the data input to the comparator 300 differs, the output com_out becomes a 'high' level. The output com_out are buffered and transferred to the output terminal through the output mode selector 400.

For example, when data of four cell arrays of the plurality of cell arrays 200 are all the same, it is decided the test result is normal and thus an output data DQ is output as a logic 'low' level. However, when one or more of data of the four cell arrays of the plurality of cell arrays 200 are different from one another, the output data DQ is output as logic 'high' as an error in the test result.

FIGS. 2 and 3 are examples of a general test circuit. FIG. 4 is a circuit diagram of a comparator illustrated in FIG. 2. FIG. 5 illustrates an example data input/output control in a general parallel bit test.

An example of parallel bit test (hereafter, referred to as "PBT") for use in a semiconductor memory device is described as follows.

In FIG. 2, during a test mode, a memory cell array 10 outputs first through fourth memory cell data D0-D3. The first memory cell data D0 are applied to a first input/output sense amplifier 20, and the second memory cell data D1 is applied to a second input/output sense amplifier 22. Furthermore, the third memory cell data D2 is applied to a third input/output sense amplifier 21 and the fourth memory cell data D3 is applied to a fourth input/output sense amplifier 23. For example, when in a PBT mode, the first to fourth input/output sense amplifiers 20 to 23 may individually output data of 0, 1, 0, 0 through a sense amplification operation, a comparison output of a first comparator 30 is provided as a fail because the first memory cell data D0 is faulty. As shown in FIG. 2, the first memory cell data D0 is not the correct data. The second comparator 32 outputs a pass signal. The first and second comparators 30 and 32 individually output a pass signal when data of two input terminals are applied in a mutually equal logic level. An output DQ0 of a third comparator 40 receiving the outputs of the first and second comparators 30 and 32 is provided as a fail when the outputs of the first and second comparators 30 and 32 are not equal.

FIG. 3, illustrates an enhanced parallel bit test (hereafter, referred to as "ePBT") of a semiconductor memory device.

In FIG. 3, during a test mode, the memory cell array 10 outputs the first through fourth memory cell data D0-D3. The first memory cell data D0 is applied to first input/output sense amplifier 20. As shown in FIG. 3, the first memory cell data D0 should be a one, but because of the faulty cell, a zero is output. The second memory cell data D1 is applied to second input/output sense amplifier 22. Furthermore, the third memory cell data D2 are applied to third input/output sense amplifier 21 and the fourth memory cell data D3 are applied to fourth input/output sense amplifier 23. For example, when in a PBT mode, the first to fourth input/output sense amplifiers 20-23 individually output data of 0, 1, 0 and 0 through a sense amplification operation. Expected data applied from a tester are respectively input as 1, 1, 0 and 0 to the first to fourth comparators 30-33. Accordingly, a comparison output of the first comparator 30 is provided as a fail, and comparison outputs of second to fourth comparators 31-33 are all provided as pass signals. The first to fourth comparators 30-33 all perform an exclusive OR (XOR_gating operation). Outputs of the first to fourth comparators 30-33 are gated through a fifth comparator 41 and output provided as the output data DQ0. The first to fourth comparators 30-33 of FIG. 3 may be respectively realized as a circuit device including MOS transistors as shown in FIG. 4.

FIG. 4 illustrates an example embodiment of the first comparator 30. The second to fourth comparators 31-33 have the same circuit configuration. For the sake of clarity and brevity, a detailed description of the second to fourth comparators 31-33 will be omitted. FDOI indicates an output of the input/output sense amplifier 20, and WDI denotes the expected data applied from the tester. When values of FDOI and WDI are the same, a low level (e.g., "0") is provided in an output node NO1 and output as comparison output data DOUT. When the values of FDOI and WDI are different from each other, a first value (e.g., "1") is provided in an output node NO1.

However, in the examples of PBT and ePBT shown in FIGS. 2 and 3, the memory cell outputting D0 may be decided as a failed cell even though the D0 memory cell is non-defective. More specifically, when a charge is discharged to a cell coupled to the same word line, the memory cell may be determined as defective. In other words, when a bridge occurs between adjacent memory cells using different bit lines but sharing the same word line, a discharge of cell data occurs, and the D0 memory cell should output data '1' but actually outputs data '0'. Such an error may occur in performing a parallel bit test by executing a data read after a data write and a lapse of given time, for example. As a result, when the read for the D0 memory cell is performed after a lapse of given time, a charge level of the D0 memory cell is discharged to a D1 memory cell and thus, the cell becomes a low level. Then, an output of the bit line sense amplifier 20 is provided as '0' and then the D0 memory cell is decided as a defective memory cell despite that the cell is a normal memory cell.

When the error occurs in the decision to determine a defective cell like in FIGS. 2 and 3, a normal memory cell is decided as a defective cell in the PBT/ePBT and screened, thus causing an overkill of memory cells and lowering a production yield. A yield drop is relatively severe like in process products having a relatively low design rule, thus, the PBT/ePBT are difficult to be applied thereto. Furthermore, in performing the test by using a normal mode, the occurrence of overkill can be prevented, but a test time increases to 4-16 times as compared with PBT.

On the other hand, as shown in FIG. 5, DQ transmission gates 24-29, 34 and 36 may be added between the sense amplifiers 20-23 and the comparators 30 and 32 for a parallel bit test. For example, when a mode control signal MOD0 is applied as a low state to the transistors 24 and 25, an output of the first input/output sense amplifier 20 is blocked and a first expected data WD0 is output to one input of the comparator 30. Therefore, an output of the first comparator 30 is provided as the pass, thereby preventing an overkill for the memory cell D0.

However, the transmission gates 24-29, 34 and 36 cause a relatively large occupation rate within the circuit. Therefore, circuit design of the semiconductor memory device becomes a burden.

However, when an error in a fail decision of a memory cell occurs in the parallel bit test, an overkill operation of the memory cell may be generated and, thus, a production yield may decrease. Furthermore, a control circuit logic is added to a normal path to perform the parallel bit test. The control circuit logic maybe difficult to realize and influence the normal path.

SUMMARY

Embodiments relate to a semiconductor memory device, and more particularly, to a parallel bit test of a semiconductor memory device to test for a defect of memory cells.

Some embodiments provide a semiconductor memory device to enhance test efficiency. The semiconductor memory device comprises a bit test circuit having an ignore function. An overkill operation of a memory cell may be prevented and an efficient test may be obtained without influencing a normal path.

According to an example embodiment, a semiconductor memory device includes a memory cell array and a bit test circuit. The memory cell array includes a plurality of memory cells. The bit test circuit is configured to perform a parallel bit test to determine defective memory cells based on bits received from the plurality of memory cells, a tester signal for each of the plurality of memory cells, and a mode register set signal for each of the plurality of memory cells. The bit test circuit is also configured to output a non-defective pass signal for at least one of the plurality of memory cells based on at least one of the at least one bit received from the at least one memory cell, the tester signal for the at least one memory cell and the mode register set signal for the at least one memory cell.

According to another example embodiment, a bit test comparator includes a first input terminal, an inversion-second input terminal and an output terminal. The first input terminal is configured to receive data from a memory cell through a sense amplifier. At least one of the second input terminal and the inversion-second input terminal are configured to output data based on a mode register set signal and a tester signal. The tester signal indicates an expected value of the data from the memory cell. The output terminal is configured to output an output signal based on data received at the first input terminal, the second input terminal and the inversion-second input terminal.

According to another example embodiment, a bit test comparator includes a first input terminal, a second input terminal, an inversion-second input terminal and an output terminal. The first input terminal is configured to receive data from a memory cell through a sense amplifier. The second input terminal is configured to receive data from an inverted NOR gate output. The tester signal and a mode register set signal are input to the NOR gate. The output signal is further based on the data received at the second input terminal. The inversion-second input terminal is configured to receive an inverted tester signal being input to the NAND gate. A tester signal indicates an expected value of the data from the memory cell. The output terminal is configured to output an output signal based on the data received at the first input terminal, the second input terminal and the inversion-second input terminal.

Another example embodiment provides a method of performing a parallel bit test for a semiconductor memory device. The method includes amplifying bits output from a plurality of memory cells in a memory cell array. The amplified bits are compared with tester signals based on mode register set signals. A signal is output indicating whether at least one of the memory cells is defective based on the comparing step.

DETAILED DESCRIPTION OF EXAMPLE EMBODIMENTS

Figure 1:
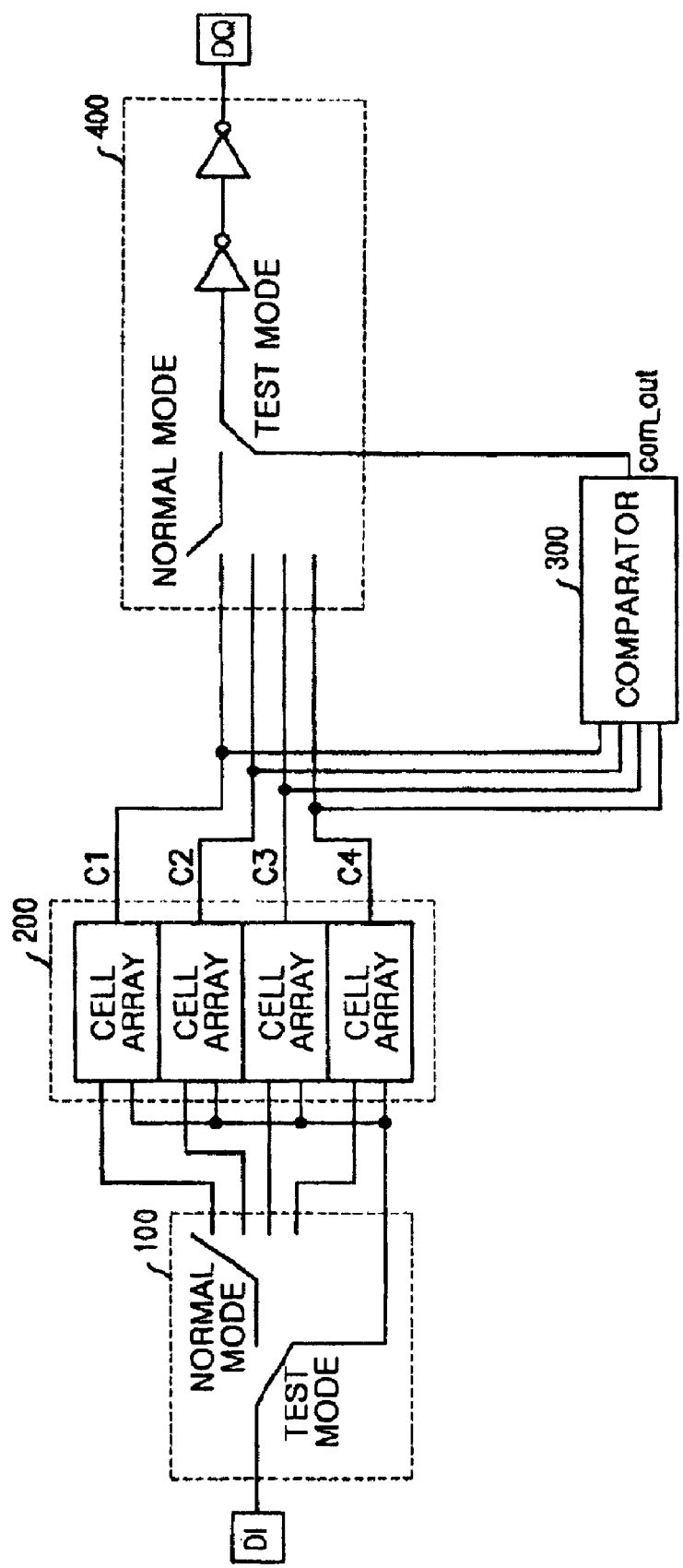
FIG. 1 illustrates test block for a semiconductor memory device.
Figure 2:
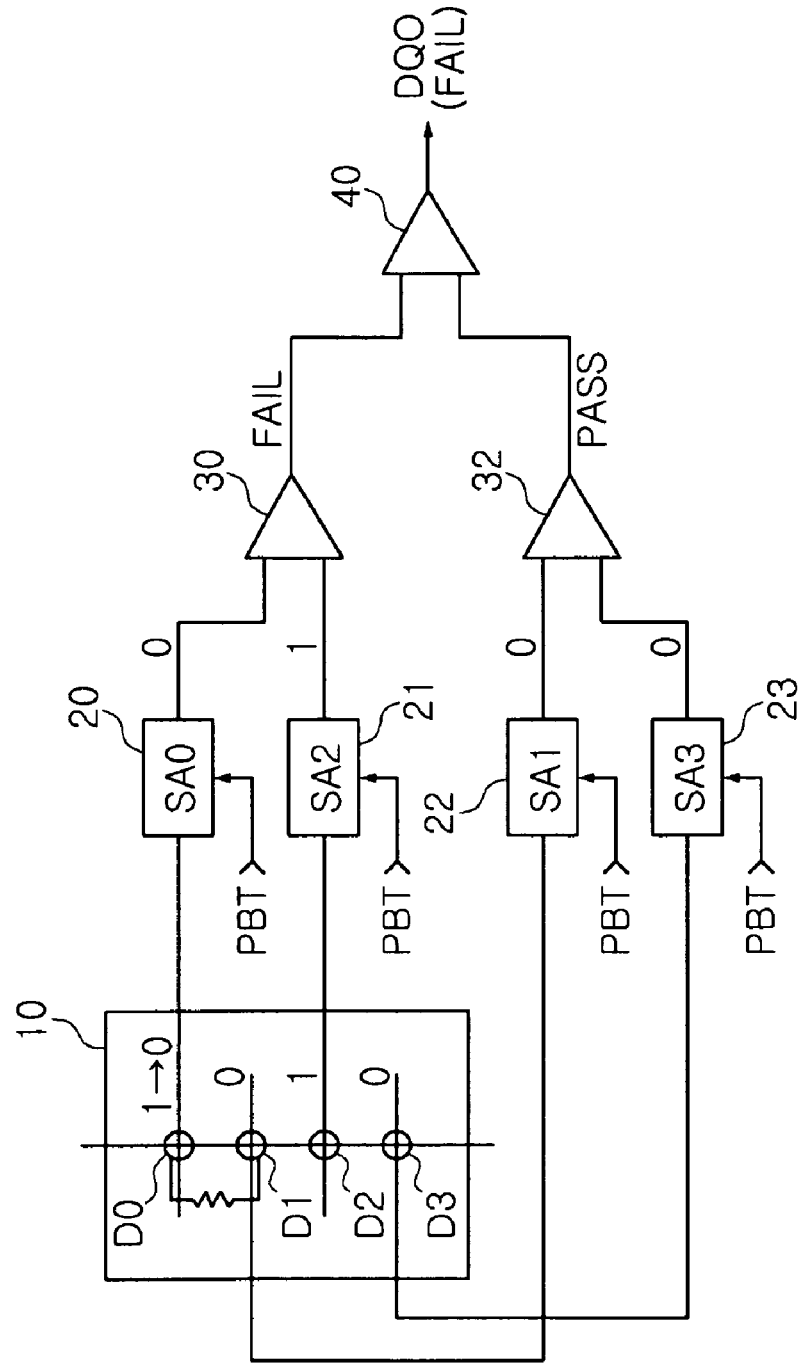
FIGS. 2 and 3 illustrate examples of general test circuits.
Figure 3:
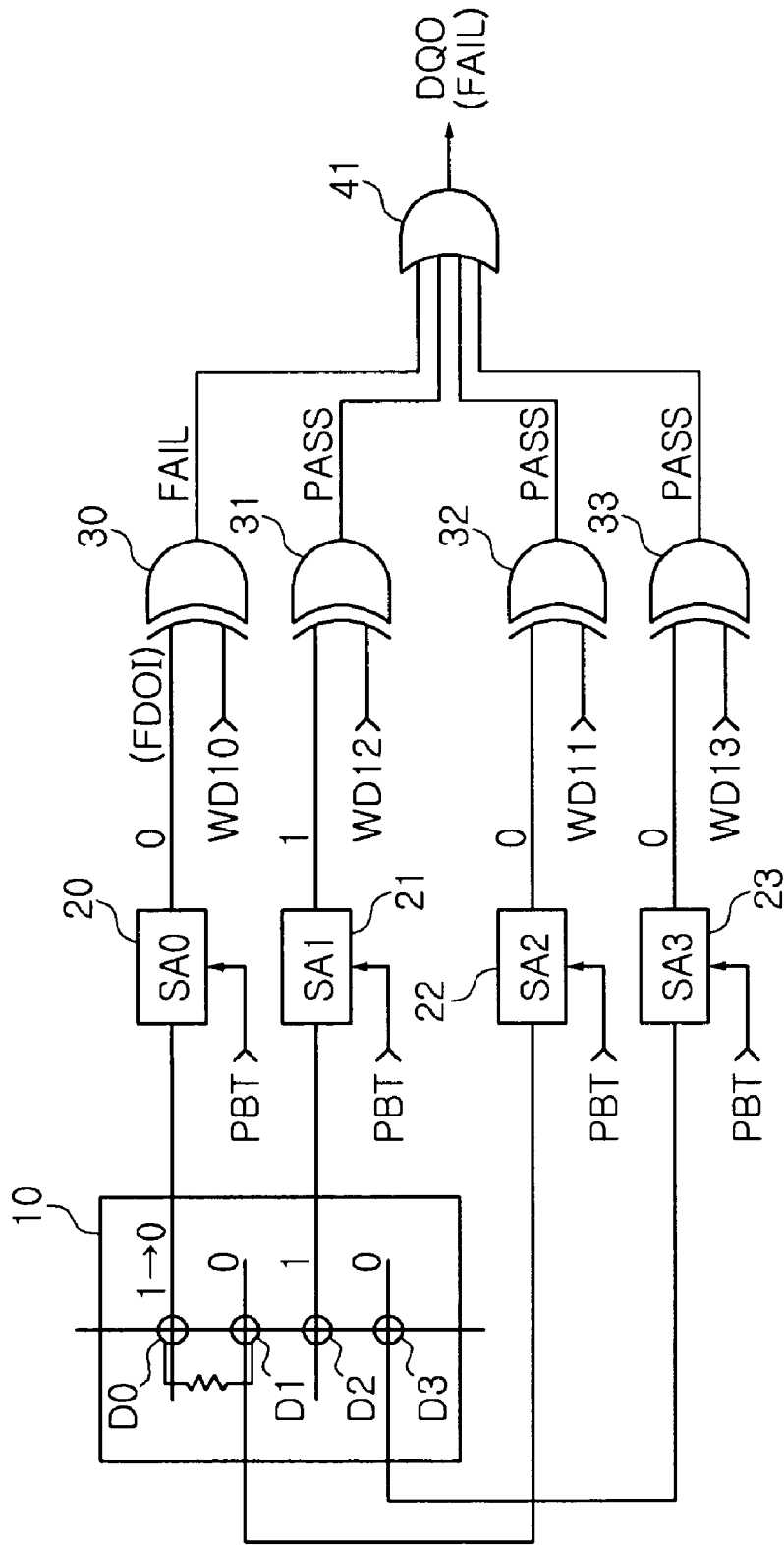
Figure 4:
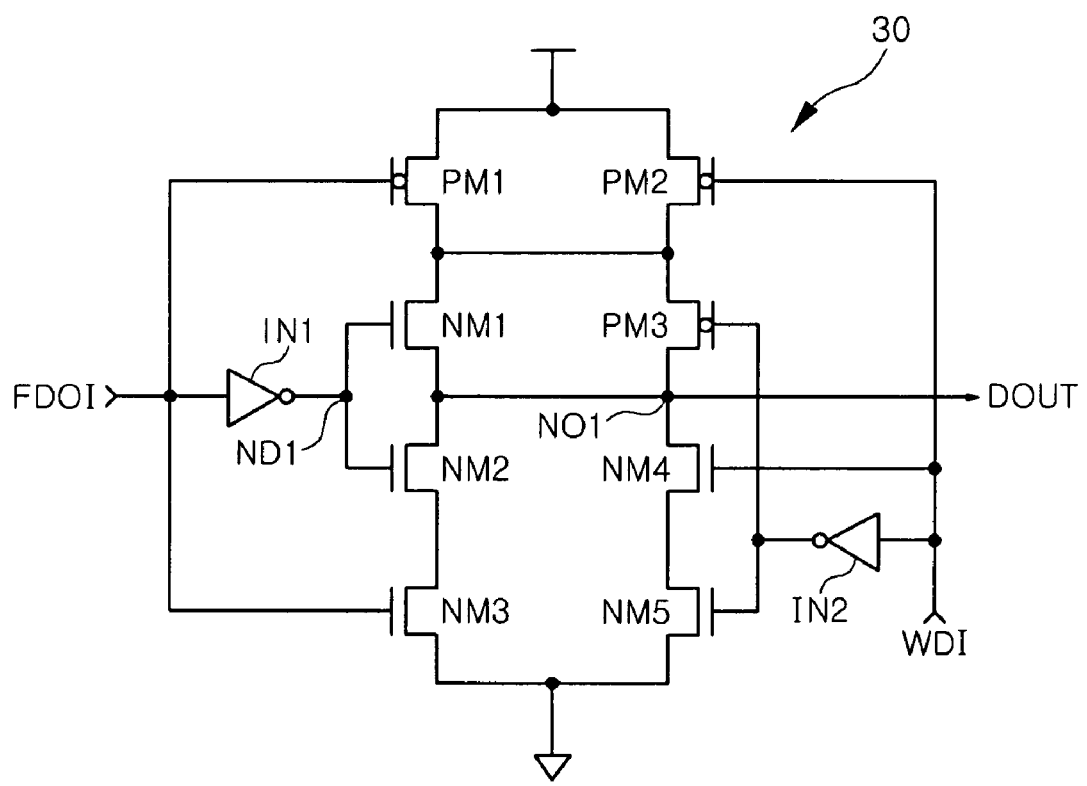
FIG. 4 is a circuit diagram of a comparator illustrated in FIG. 2.
Figure 5:
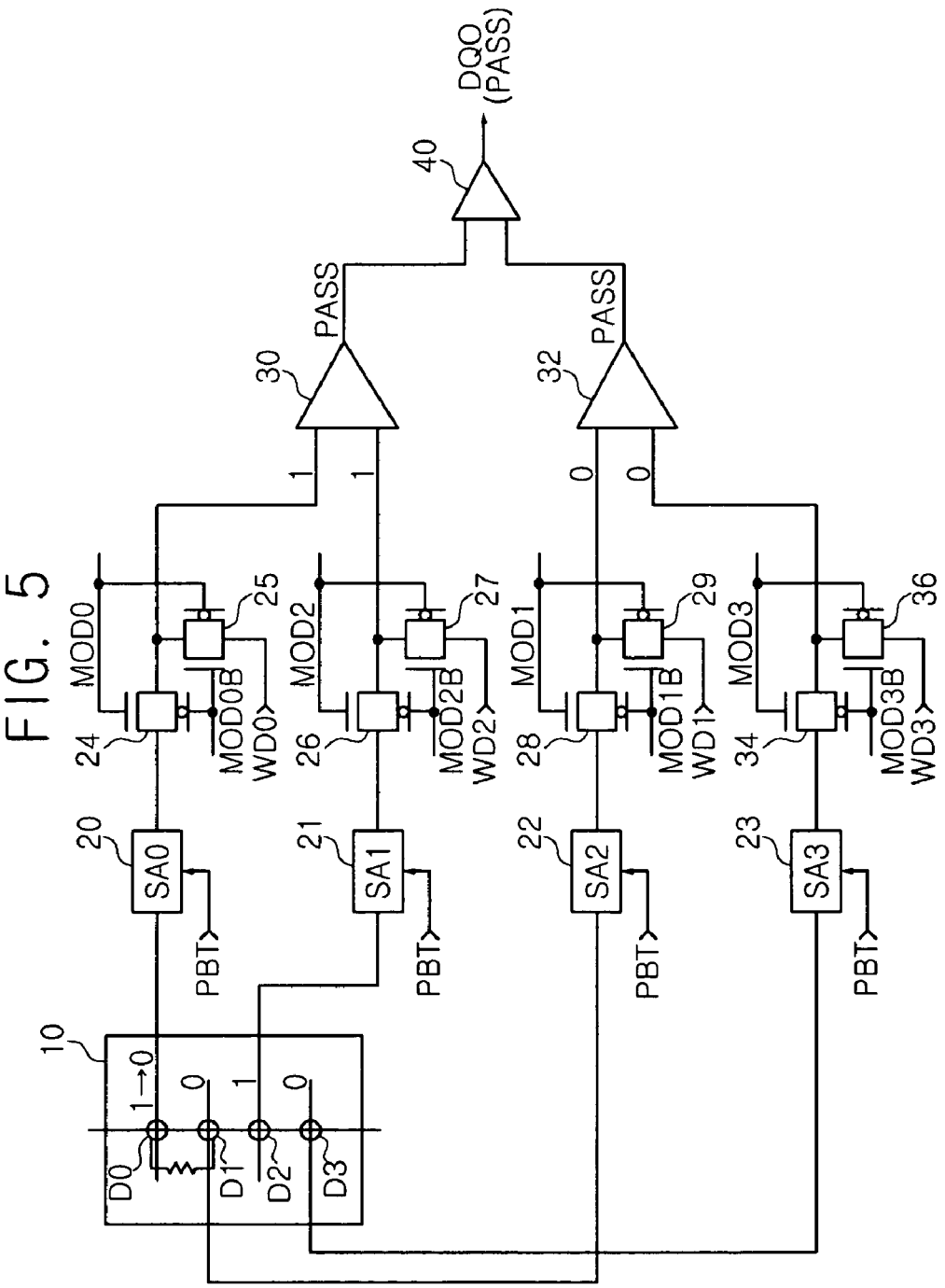
FIG. 5 illustrates a data input/output control in a general parallel bit test.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor memory device comprising a bit test circuit with an ignore function is described as follows, with reference to the accompanying drawings according to some example embodiments.

Figure 12:
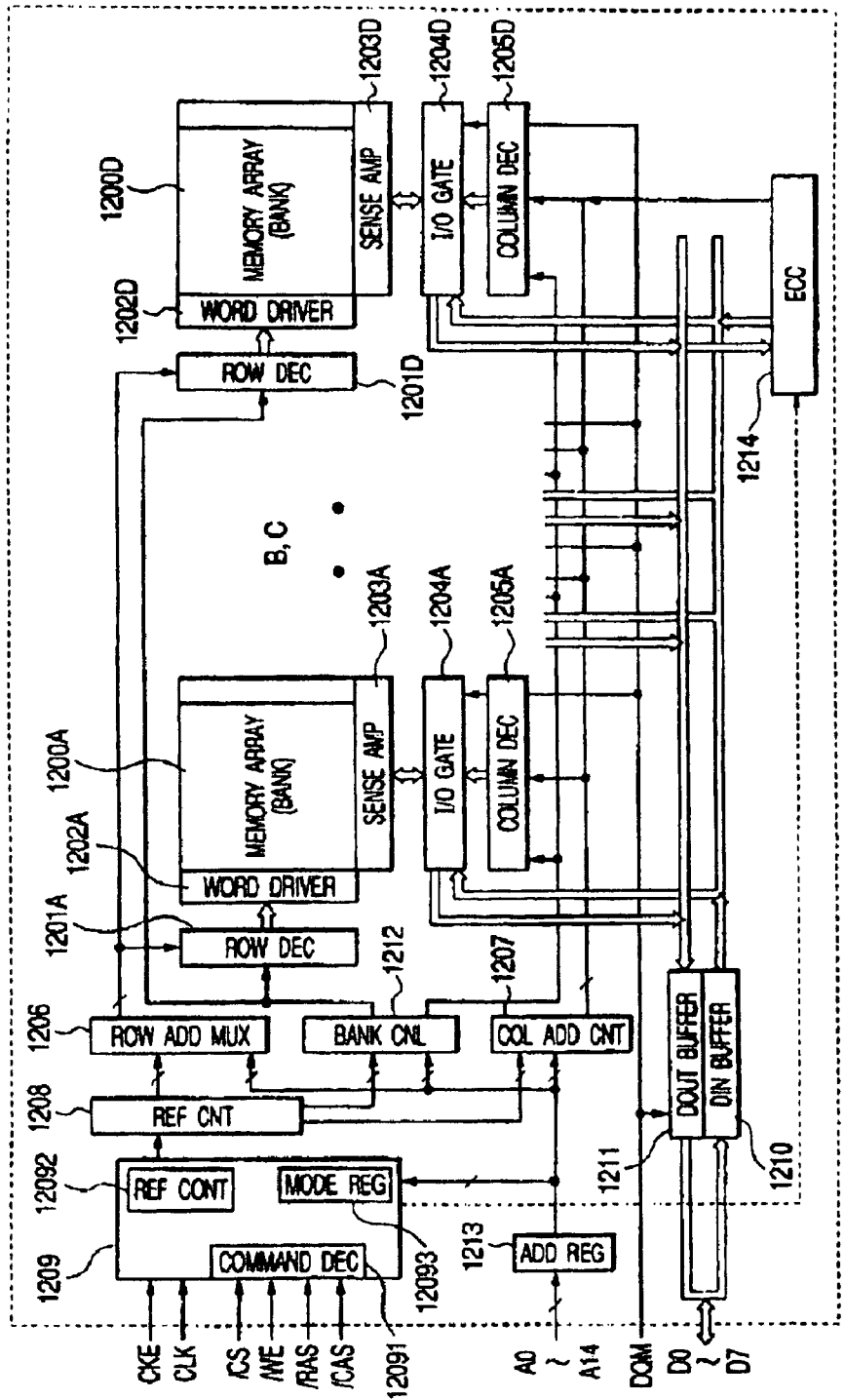
FIG. 12 illustrates a semiconductor memory device according to an example embodiment.
Figure 13:
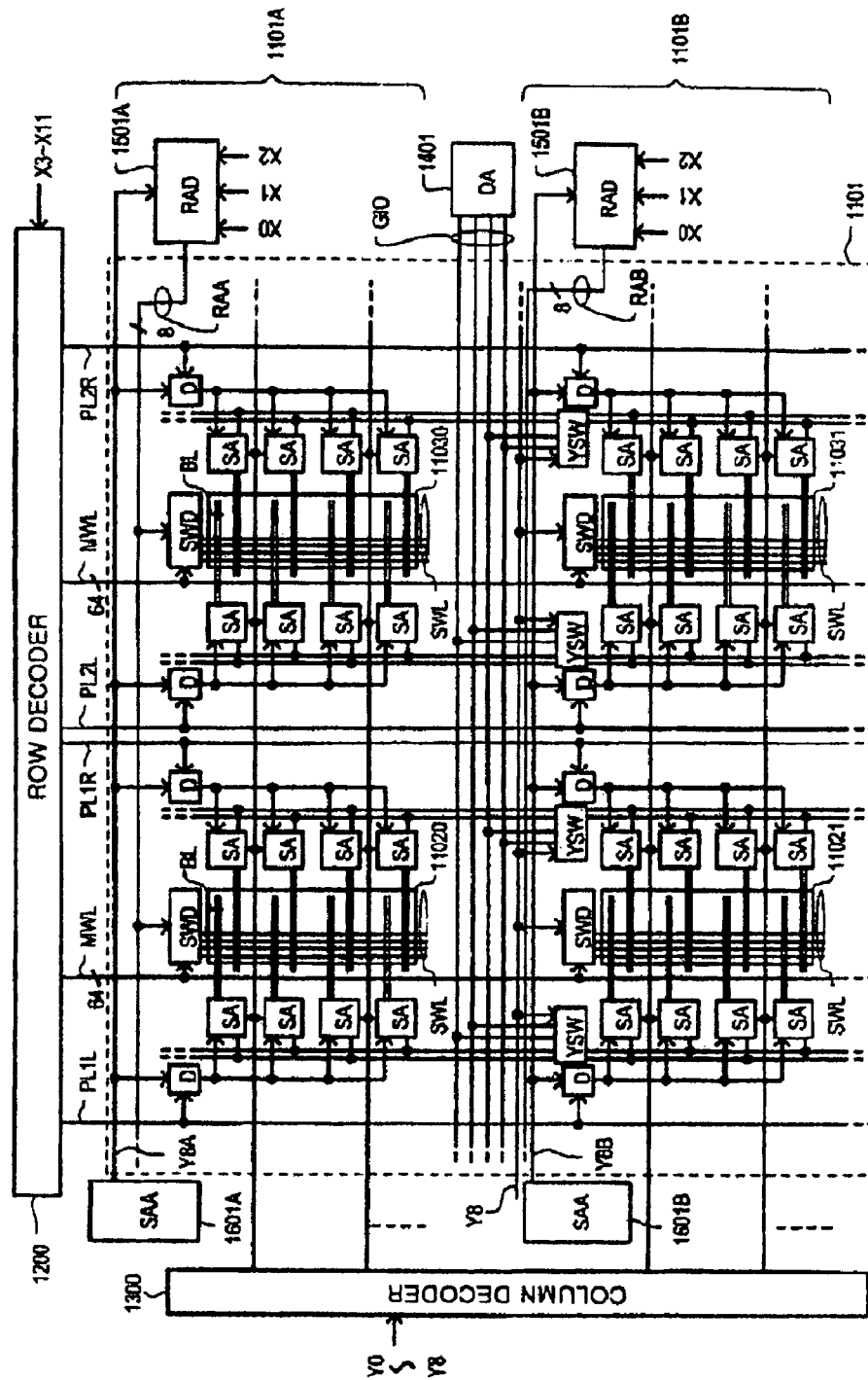
FIG. 13 illustrates a memory bank shown in FIG. 12.

FIG. 12 illustrates a semiconductor memory device. FIG. 13 illustrates a memory bank shown in FIG. 12.

In FIG. 12, an example of SDRAM (Synchronous Dynamic Access Memory) is illustrated.

The SDRAM includes four memory arrays (e.g., memory banks) 1200A-1200D. Each of the memory arrays 1200A-1200D includes dynamic type memory cells disposed in a matrix and word lines driven by a row decoder. For example, the word lines (not shown) of the memory array 1200A may be initially driven according to an output of a row decoder 1201A. A word driver 1202A is driven by a row decoding result of the row decoder 1201A, and the word driver 1202A drives from the word line corresponding to the row decoding result. A data line (not shown) in the memory array 1200A is coupled to a sense amplifier 1203A. The sense amplifier 1203A is coupled to a column decoder 1205A through an I/O gate circuit 1204A. The I/O gate 1204A may be used as a column selection circuit.

The sense amplifier 1203A is provided to detect and amplify a minute potential difference appearing in a data line coupled to a memory cell in a sensing operation.

It should be understood that each of the memory arrays 1200A-1200D includes a corresponding row decoder 1201A-D, sense amplifier 1203A-D, I/O gate circuit 1204A-D and column decoder 1205A-D. Therefore, a detailed description is only provided for the memory cell array 1200A. An I/O line for each of the I/O gate circuits 1204A-D is coupled with an output terminal of a data input circuit 1210 and an input terminal of data output circuit 1211. Though not limited, terminals D0-D7 are data input/output terminals for the data input circuit 1210 and the data output circuit 1211.

An address signal, including bits A0-A14, supplied from an address input terminal is stored in an address register 1213. The address register 1213 supplies a row address signal that selects a memory cell to row decoders 1201A-D through a row address multiplexer 1206. Bits A13 and A14 are used by a bank control circuit 1212 to select at least one of the memory banks 1200A-1200D. For example, a selection signal to select the four memory banks may be provided. A column address supplied from the address register 1213 is stored in a column address counter 1207. A refresh counter 1208 may generate a row address for auto-refreshing. The refresh counter 1208 may generate a row address and a column address for self-refreshing.

The column address signals input in time-series are supplied as preset data to the column address counter 1207. In a burst mode designated by a command etc., the column address signal as the preset data or a sequentially incremented value of the column address signal is applied to the column decoder 1205A-1205D for the corresponding memory bank 1200A-1200D.

A control logic 1209 may comprise a command decoder 12091, a refresh controller 12092 and a mode register 12093. The mode register 12093 stores various kinds of operation mode information.

Each of the row decoders 1201A-1201D operates for a corresponding memory bank 1200A-1200D. The designated row decoders 1201A-1201D perform a selection operation of a word line. The control circuit 1209 receives external control signals and address signals. The external control signals may include a clock signal CLK, a clock enable signal CKE, a chip selection signal/CS (reference code '/' indicating a row enable signal), a column address strobe signal/CAS, a row address strobe signal/RAS, and a write enable signal/WE, and the address signals are input to control circuit 1209 through the mode register 12093. The control logic circuit 1209 produces internal timing signals to control an operation mode of SDRAM and operation of the circuit blocks based on a change or timing of signal level.

FIG. 13 illustrates a sub-array of a memory bank shown in FIG. 12.

FIG. 13 illustrates a sub-array 1101. Pluralities of sub-arrays constitute one bank. The sub-array 1101 is coupled to a row decoder 1200 and a column decoder 1300. The sub-array 1101 includes sub-array areas 1101A and 1101B. Plates 11020 and 11030 are in the sub-area 1101A and plates 11021 and 11031 are in the sub-area 1101B. Main word lines MWL may be disposed in a row direction of the sub-array 1101. A sub word driver SWD is coupled to a main word line MWL and coupled with sub word lines SWL. The sub word lines SWL may be selected based on signals RAA, RAB sent by RA drivers 1501A, 1501B, respectively. Each sub word driver SWD can drive four or eight sub word lines SWL for one main word line.

The sub-array areas 1101A, 1101B may include the respective RA driver 1501A, 1501B and a respective sense amplifier activation control unit 1601A, 1601B to drive bit line sense amplifiers SA. The sense amplifier activation control units 1601A, 1601B may supply respective control signals Y8A, Y8B to sense amplifier drivers D. The sense amplifier activation control units 1601A, 1601B may also supply the respective control signals Y8A, Y8B to the RA driver 1501A, 1501B. Each sense amplifier activation control unit 1601A, 1601B enables a column of plates PLT. The sense amplifier activation control units 1601A, 1601B can enable all even-columns or all odd-columns of the plates 11020, 11021, 11030, 11031 by using the control signals Y8A, Y8B, respectively.

As shown in FIG. 13, the RA driver 1501A may supply a 4-bit or 8-bit sub word line selection signal RAA to a column of sub word line driver SWD adapted within a column of plate to which the plates 11020, 11030 belong. On the other hand, the RA driver 1501B may supply 4-bit or 8-bit sub word line selection signal RAB to a column of sub word line driver SWD adapted in a column of plate to which the plates 11021, 11031 belong.

In a semiconductor memory device having the structure described above referring to FIGS. 12 and 13, the parallel bit test is used as the method of merging a plurality of data output pins in parallel within the range capable of repairing memory cells of a minimum unit through a recent continuing development. For example, when data output pins are merged in a unit of four or eight, a pass/fail decision as the test result is obtained through one representative data output pin among the four or eight data output pins.

In example embodiments shown in FIGS. 6-11, an overkill operation of a memory cell may be prevented or reduced through a prevention of decision error for memory cells sharing the same word line. As a result, the production yield can increase, the test speed becomes the same as that in ePBT and there is no test time increase. In addition, the normal path does not have any influence by using ePBT logic path.

For example, in an ePBT mode, four data FDOI output from four memory cells, respectively, are compared with corresponding expected data WDI input into corresponding comparators in a read operation. When specific output terminal or specific data among output data is excepted from the pass/fail decision, the test time can be shortened and an efficient screening capability can be enhanced without influencing the normal path.

Example embodiments will be described as follows, referring to FIGS. 6-11.

First Embodiment

Figure 6:
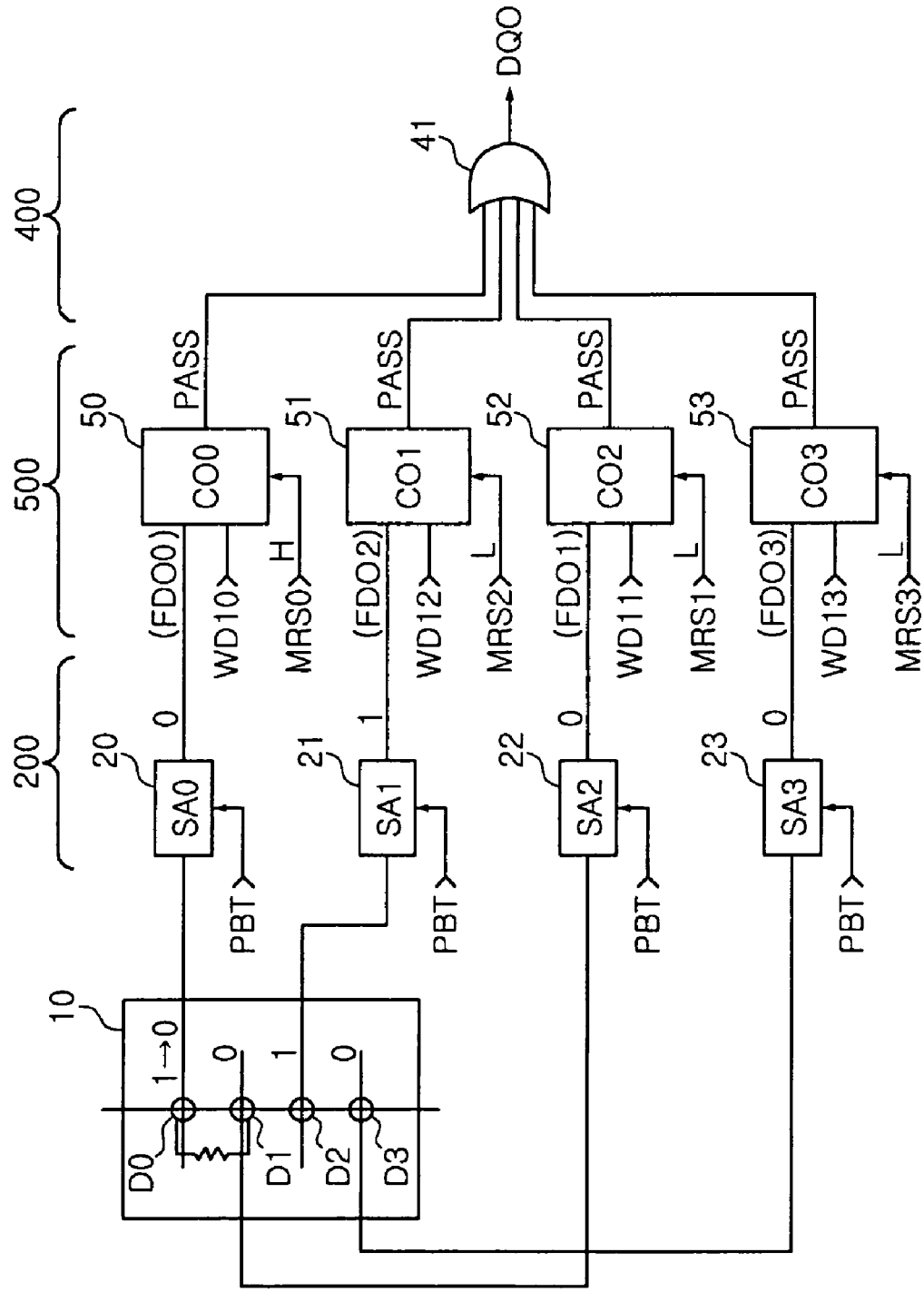
FIG. 6 illustrates a parallel bit test circuit according to an example embodiment.

FIG. 6 illustrates a semiconductor memory device including a memory cell array 10, a plurality of sense amplifiers 200, an output unit 400 and a bit test circuit 500. The plurality of sense amplifiers 200 includes first to fourth input/output sense amplifiers 20 to 23. The bit test circuit 500 includes first to fourth comparators 50 to 53 and the output unit 400 includes a composite output unit 41.

The memory cell array 10 has a repair scheme based on a unit of column selection line CSL. The first to fourth comparators 50 to 53 correspond to a bit test circuit. The bit test circuit performs a parallel bit test for memory cells outputting data D1-D3 (e.g., data 0, 1, 0) while ignoring at least one data input/output terminal, (e.g., input FDO0 of the first comparator 50). In FIG. 6, the memory cell outputting data D0 is the ignored memory cell selected from a plurality of data input/output terminals to be tested within the memory cell array 10.

In FIG. 6, the output of the first sense amplifier 20 becomes "ignore", and cell data provided through the remaining three input/output terminals of the second through fourth sense amplifiers 21-23 are respectively compared to expected data WD11-WD13 in second to fourth comparators 51, 52 and 53. As a result, the first comparator 50 outputs a pass signal regardless of whether output data of the first input/output sense amplifier 20 is '1' or '0', and thus a comparison result of the second to fourth comparators 51, 52 and 53 determines the result of the test.

The first comparator 50 does not compare data (e.g. "0") provided through the selected data input/output terminal FDO0 as a gating result to expected data WD10 applied from a tester when a mode register set signal MRS0 has a first logic level (e.g., logic "H"). Regardless of the data provided from the selected-data input/output terminal FDO0, the comparator 50 outputs a "pass" signal because the mode register set signal MRS0 is the first value. In this case, mode register set signals MRS1-MRS3 of a second value (e.g., logic "L") are applied to each of the second to fourth comparators 51-53. Therefore, the second to fourth comparators 51-53 compare the data provided through the data input/terminals FDO2, FDO1, FDO3 to the expected data WD12, WD11, WD13, respectively.

As described above, when the mode register set signal MRS0 is the first value, the data input/output terminal of the first input/output sense amplifier 20 is ignored and an output of the first comparator 50 is a pass signal. For example, the comparators 50 and 51 output pass signals when the mode register set signals MRS0 and MRS2 are the first value.

Figure 7:
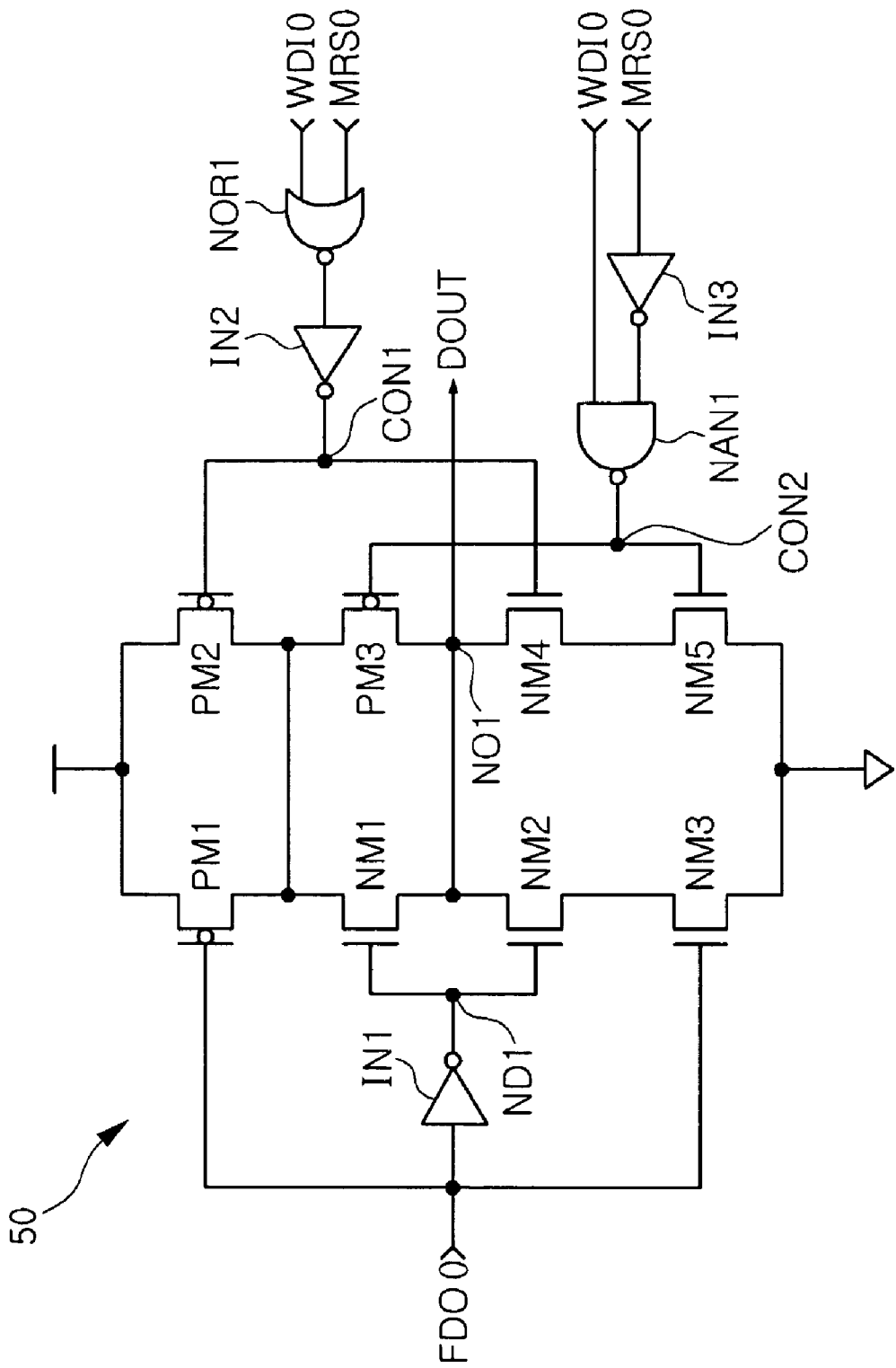
FIG. 7 illustrates a comparator according to the example embodiment in FIG. 6.

An example embodiment of the first comparator 50 is provided in FIG. 7. However, it should be understood that the second to fourth comparators 51-53 have the same configuration as the first comparator 50. Therefore, for the sake of clarity and brevity, a description of the second to fourth comparators 51-53 will not be provided.

Referring to FIG. 7, four MOS transistors PM1, NM1, NM2 and NM3, coupled in series between power source voltage and ground voltage, are coupled symmetrically with the other four MOS transistors PM2, PM3, NM4 and NM5, coupled in series between power source voltage and ground voltage. A connection structure among NOR gate NOR1, NAND gate NAN1 and inverters IN2 and IN3 is shown. The MOS transistors and an inverter form one exclusive OR (XOR).

The bit test comparator 50, shown in FIG. 7 includes first and second input terminals FDOI and CON1, an inversion-second input terminal CON2, and an output terminal DOUT, and an exclusive OR gate.

That is, data provided through data input/output terminal coupled to a memory cell through the sense amplifier is applied to the first input terminal FDOI. Furthermore, a result inverted after performing a NOR-gating of expected data WDI applied from the tester and a mode register set signal MRSI applied to a semiconductor memory device is input to the second input terminal CON1. Furthermore, an inverted mode register set signal MRSI and the expected data WDI is input to NAND gate NAN1 and output to the inversion-second input terminal CON2.

As shown in FIG. 6, the mode register set signal MRSO is applied as the first value when data of a specific data input/output terminal becomes "ignore", or is applied as a second value when a comparison operation is performed without "ignore".

Consequently, the comparator of FIG. 7 outputs comparison result data through an output node NO1 regardless of the value of the first input terminal FDOI when receiving the mode register set signal MRS as the first value. That is, a specific output becomes ignored, thereby preventing a decision error for memory cells sharing the same word line. As a result, overkill is reduced and thus a production yield increases, and also a test speed becomes equal to ePBT. Furthermore, the execution of "ignore" is realized by using ePBT logic path and thus no influence acts on a normal path.

Second Embodiment

Figure 8:
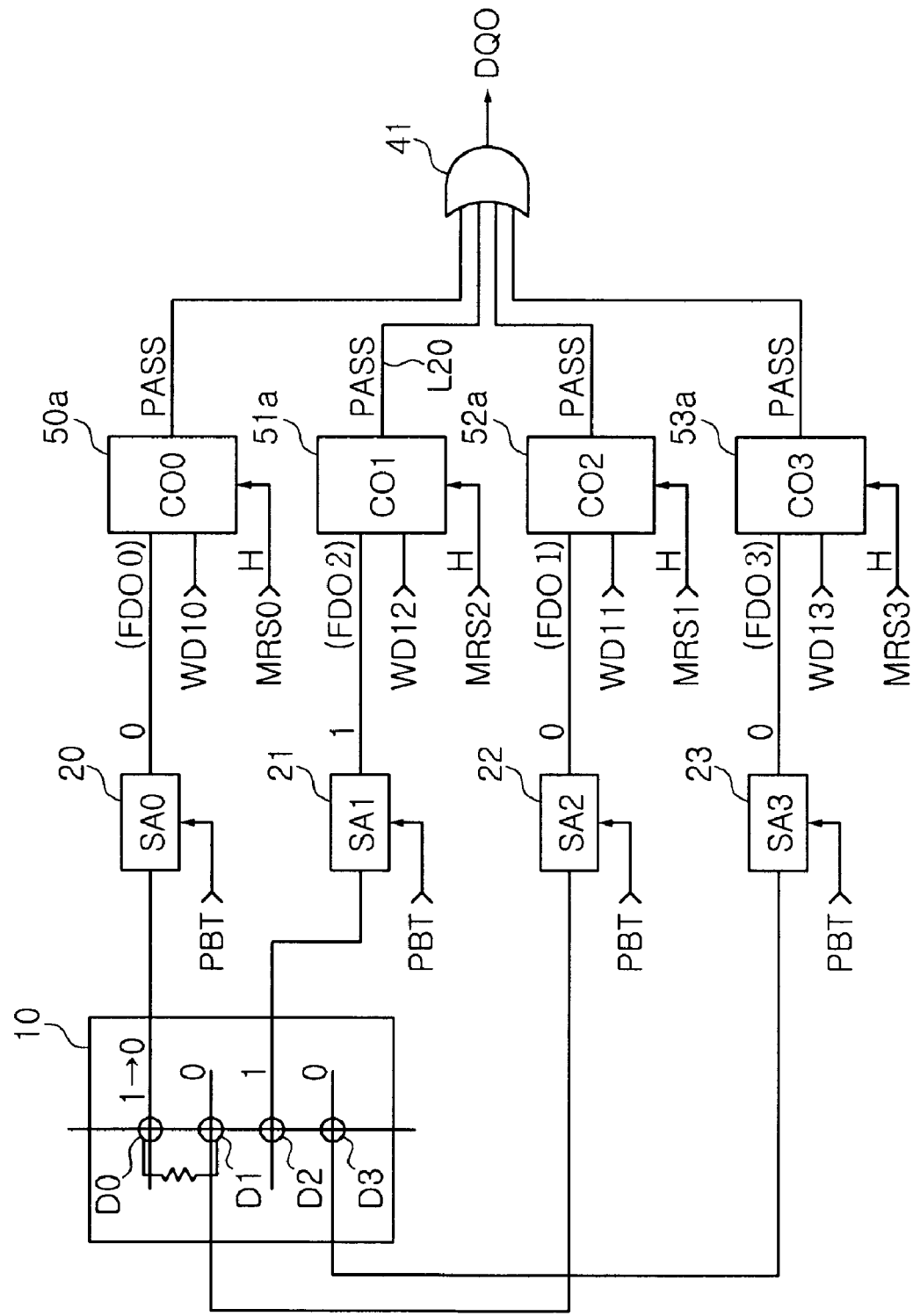
FIG. 8 illustrates a parallel bit test circuit according to another example embodiment.
Figure 9:
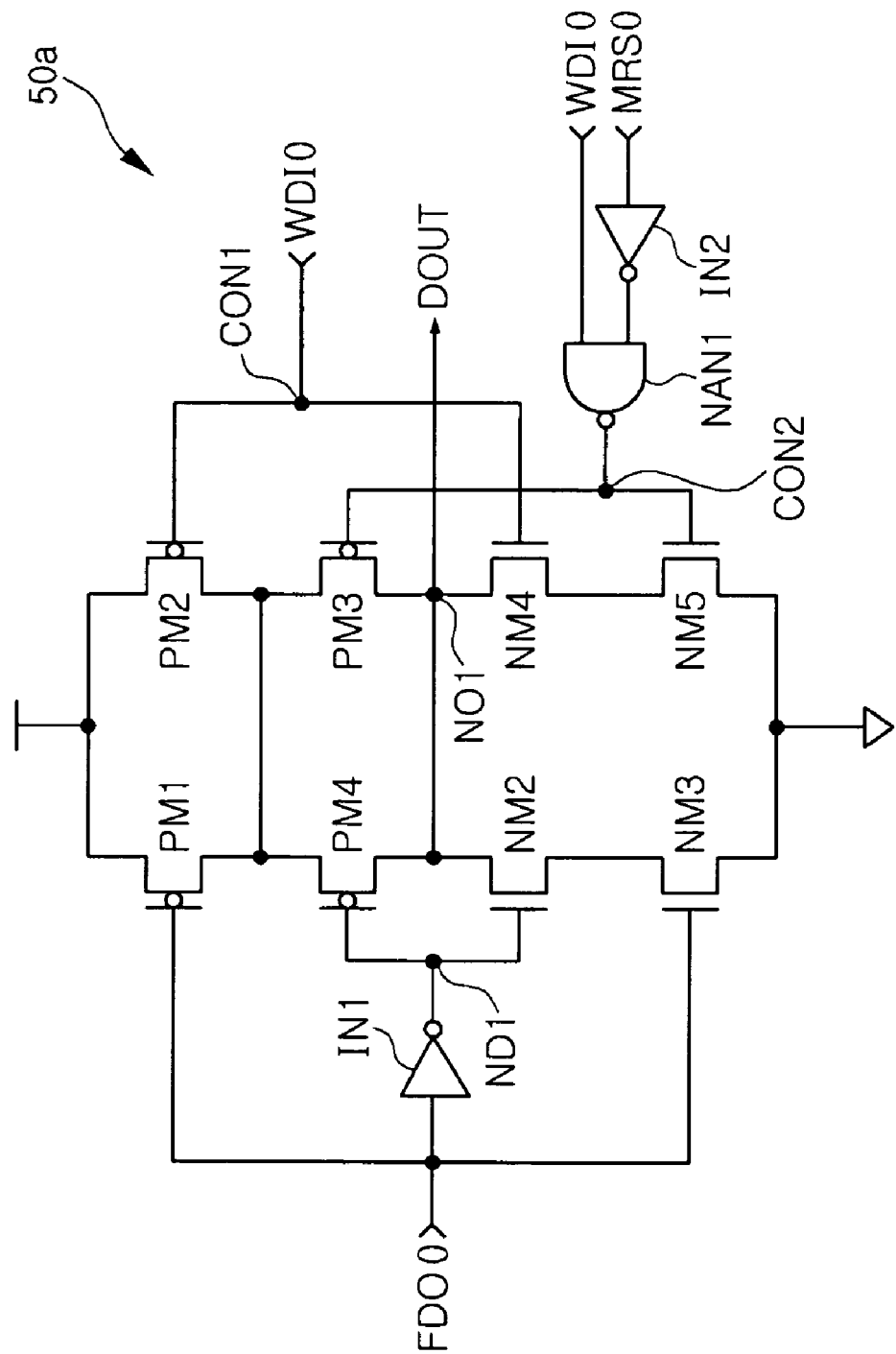
FIG. 9 illustrates a comparator according to the example embodiment in FIG. 8.

FIG. 8 is a block diagram of a parallel bit test circuit according to another example embodiment. FIG. 9 is a circuit diagram illustrating in detail a comparator of FIG. 8.

FIG. 8 shows a semiconductor memory device including the memory cell array 10, first to fourth input/output sense amplifiers 20-23, first to fourth comparators 50a-53a and the composite output unit 41.

The memory cell array 10 has a repair scheme based on a unit of column selection line CSL. The first to fourth comparators 50a-53a correspond to a bit test circuit. The bit test circuit performs a parallel bit test for memory cells outputting data D0-D3. In the embodiment shown in FIG. 8, the data from the memory cells that is input into the first to fourth comparators 50a-53a as the first value is ignored.

Each of the comparators 50a-53a is configured to receive data provided through a corresponding data input/output terminal FDO0-FDO3, expected data WD10-WD13, and a mode register set signal MRS0-MRS3 and to output a pass signal regardless of the data through the data input/output terminal FDO0-FDO3 when the mode register set signal has the first logic level (e.g., logic "H") and the expected data is the first value (e.g., 1).

Consequently, a parallel bit test is performed while data from the memory cells corresponding to expected data of 1 are ignored. That is, data from the memory cells corresponding to expected data of 0 determine the result of the test. In FIG. 8, data provided through the data input/output terminals FDO0 and FDO2 are ignored, and the first and second comparators 50a and 51a output pass signals regardless of the data provided through the data input/output terminals FDO0 and FDO2. Therefore, data provided through the data input/output terminals FDO1 and FDO3 determine the result of the test.

An example embodiment of the first comparator 50a is illustrated in FIG. 9. However, it should be understood that the second to fourth comparators 51a-53a have the same configuration as the first comparator 50a. Therefore, for the sake of clarity and brevity, a description of the second to fourth comparators 51a-53a will not be described.

Referring to FIG. 9, four MOS transistors PM1, PM4, NM2 and NM3, coupled in series between power source voltage and ground voltage, are coupled symmetrically with the other four MOS transistors PM2, PM3, NM4 and NM5 which are coupled in series between power source voltage and ground voltage. A connection structure of NAND gate NAN1 and an inverter IN2 are also shown. The MOS transistors and an inverter IN1 form one exclusive OR gate (XOR).

The bit test comparator 50a shown in FIG. 9 includes first and second input terminals FDOI and CON1, the inversion-second input terminal CON2, and the output terminal DOUT, and an exclusive OR gate.

Data provided from the sense amplifier coupled to a memory cell is applied to the first input terminal FDOI. Expected data WDI applied from the tester is applied to the second input terminal CON1. An inverted mode register set signal MRSI applied to a semiconductor memory device and the expected data WDI are input to a NAND gate. The output of the NAND gate is input to the inversion-second input terminal CON2.

As shown in FIG. 8, the mode register set signals MRS0-MRS3 are all applied as the first logic level to the comparators 50a-53a to ignore data corresponding to expected data having the first value (e.g., '1').

For example, when expected data are "0101", respectively, data output from the memory cells corresponding to expected data of 0 determine the result of the parallel bit test.

Accordingly, specific data becomes "ignore" and the rest of the data output from the memory cells data can be compared. Thus, an overkill can be reduced corresponding to a corresponding level. Furthermore, a test speed becomes equal to ePBT, and the execution of "ignore" and a comparison function is obtained by using the ePBT logic path, thus nothing influencing the normal path.

Third Embodiment

Figure 10:
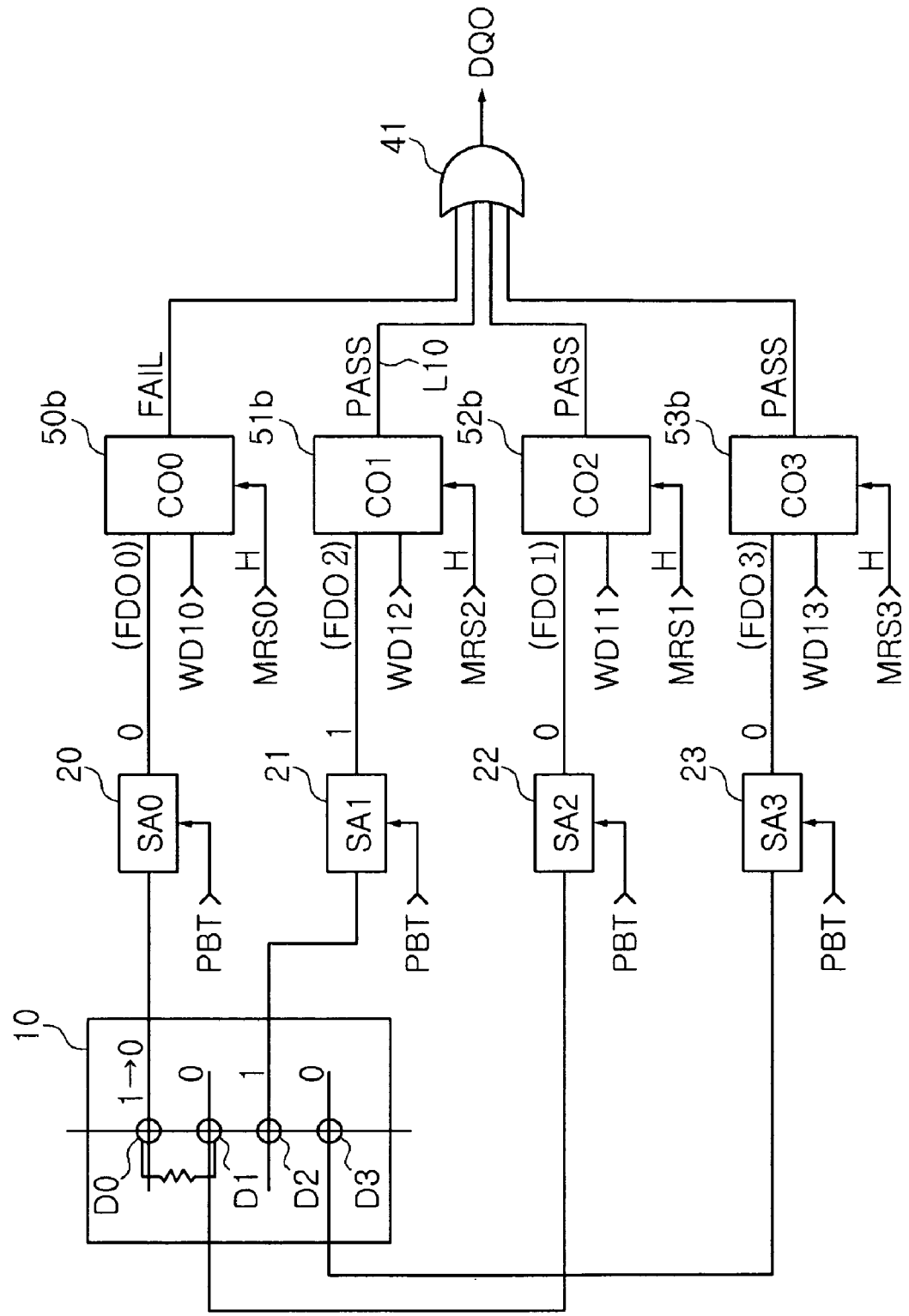
FIG. 10 illustrates a parallel bit test circuit according to another example embodiment.
Figure 11:
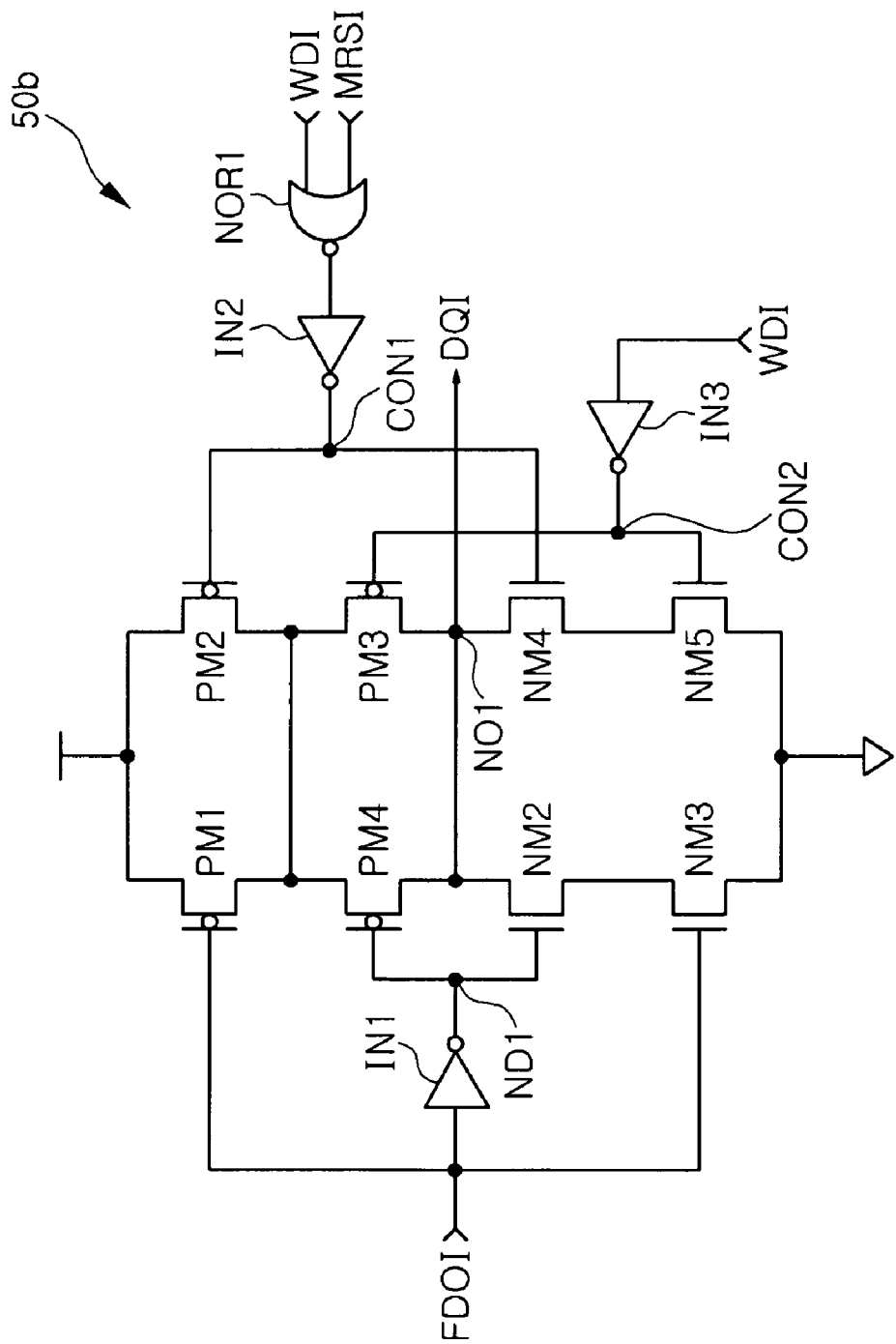
FIG. 11 illustrates a comparator according to the example embodiment in FIG. 9.

FIG. 10 is a semiconductor memory device including a parallel bit test circuit according to another example embodiment. FIG. 11 is a circuit diagram illustrating more in detail a comparator of FIG. 10.

The semiconductor memory device includes the memory cell array 10, first to fourth input/output sense amplifiers 20-23, first to fourth comparators 50b-53b, and the composite output unit 41.

The memory cell array 10 has a repair scheme based on a unit of column selection line CSL. The first to fourth comparators 50b-53b correspond to a bit test circuit. The bit test circuit performs a parallel bit test for memory cells outputting data D0-D3. The data from the memory cells D0-D3 that is input to the comparators 50b-53b as the second value is ignored.

Each of the comparators 50b-53b is configured to receive data provided through a corresponding data input/output terminal FDO0-FDO3, expected data WD10-WD13, and a mode register set signal MRS0-MRS3 and to output a pass signal regardless of the data through the data input/output terminal FDO0-FDO3 when the mode register set signal has the first logic level (e.g., logic "H") and the expected data is the second value (e.g., 0).

Consequently, a parallel bit test is performed while data from the memory cells corresponding to expected data of 0 are ignored. That is, data from the memory cells corresponding to expected data of 1 determine the result of the test. In FIG. 10, data provided through the data input/output terminals FDO1 and FDO3 are ignored, and the first and second comparators 52b and 53b output pass signals regardless of the data provided through the data input/output terminals FDO1 and FDO3. Therefore, data provided through the data input/output terminals FDO0 and FDO2 determine the result of the test.

An example embodiment of the first comparator 50b is illustrated in FIG. 11. However, it should be understood that the second to fourth comparators 51b-53b have the same configuration as the first comparator 50b. Therefore, for the sake of clarity and brevity, a description of the second to fourth comparators 51b-53b will not be provided.

Referring to FIG. 11, four MOS transistors PM1, PM4, NM2 and NM3, coupled in series between power source voltage and ground voltage, are coupled symmetrically with the other four MOS transistors PM2, PM3, NM4 and NM5 which are coupled in series between power source voltage and ground voltage. A connection structure of NOR gate NOR1 and inverters IN2 and IN3 is also shown. The MOS transistors and inverter IN1 form one exclusive OR gate (XOR).

A bit test comparator shown in FIG. 11 comprises first and second input terminals FDOI and CON1, inversion-second input terminal CON2, and an output terminal DOUT, and has an exclusive OR gate.

Data provided through data input/output terminal coupled to a memory cell through the sense amplifier is applied to the first input terminal FDOI. A mode register set signal MRSI and expected data WDI applied from the tester is input to a NOR gate. The output of the NOR gate is input to the second input terminal CON1. An inverted result of the expected data WDI is applied to the inversion-second input terminal CON2.

As shown in FIG. 10, the mode register set signals MRS0-MRS3 are all applied as the first logic level to the comparators 50b-53b to ignore data corresponding to expected data having the second value (e.g., '0').

For example, when expected data are "0101", respectively, data output from the memory cells corresponding to expected data of '1' determine the result of the parallel bit test.

The third embodiment provides the following enhancement like in the second embodiment.

An overkill factor of data can be eliminated by selectively deciding respective cell data. In addition, data can be tested in an acceleration condition, thereby providing an improved test.

In other words, a data becomes "ignore", thereby removing an overkill factor and using an ePBT logic, and thus providing a reduction effect of test time as compared with a normal mode.

Accordingly, in example embodiments, a defect detection of specific DQ or specific data like in a cell defect detection on the same word line may be enhanced.

It will be apparent to those skilled in the art that modifications and variations can be made to the example embodiments.

For example, in other cases, a circuit structure in a comparator may become different. Furthermore, while example embodiments are described with reference to first and second values, it should be understood that values may logic "H" (e.g., 1) and logic "L" (e.g., 0), respectively, or vice versa.

In addition, although a comparison of 4DQ in DRAM is provided as the example in the above-description, an extensive application to 8DQ is available and may be appropriate to a defect test of DRAM cell of DDR2 and DDR3 types. However, a test technique may be extendedly applied not only in various structures of DRAMS but also in other volatile memory etc.

In the drawings and specification, there have been disclosed typical embodiments and, although specific terms are employed, they are used in a generic and descriptive sense just and not for limitation, the scope being set forth in the following claims.

What is claimed is:

1. A semiconductor memory device comprising:
a memory cell array including a plurality of memory cells; and
a bit test circuit configured to perform a parallel bit test to determine defective memory cells, the bit test circuit including a plurality of data input/output terminals operationally coupled to the plurality of memory cells,
wherein the bit test circuit is configured to ignore a first data provided to at least one data input/output terminal and perform the parallel bit test for a second data provided to remaining input/output terminals, and
the bit test circuit includes a plurality of comparators coupled to each of the plurality of input/output terminals, each of the comparators includes,
a first input configured to receive data from the data input/output terminal,
a second input configured to receive expected data from a tester, and
a third input coupled to an output of a mode register, the third input is configured to receive a mode register set signal, the comparators are configured to output a non-defective pass signal for ignored data based on at least one of the data, the expected data and the mode register set signal.

2. The semiconductor device of claim 1, wherein at least one of the comparators is configured to output the non-defective pass signal regardless of a value of the data if the mode register set signal is a first value.

3. The semiconductor device of claim 1, wherein at least one of the comparators is configured to output the non-defective pass signal if the data is a first value.

4. The semiconductor device of claim 1, wherein the comparator is configured to compare the data to the expected data if the mode register set signal is a second value.

5. The semiconductor device of claim 1, wherein
each memory cell is configured to output data to a sense amplifier,
the sense amplifier is configured to amplify the data and output the data to one of a plurality of comparators, and
the comparator is configured to receive the amplified data, the expected data and the mode register set signal, and compare the expected data to the data.

6. The semiconductor device of claim 5, wherein the comparator is configured to output a non-defective pass signal when the mode register set signal is a first value.

7. The semiconductor device of claim 6, wherein the comparator is configured to compare the expected data to the data if the mode register set signal is a second value and if the expected data is the same as the data, the comparator is configured to output a non-defective pass signal.

8. The semiconductor device of claim 5, wherein the comparator is configured to output a non-defective pass signal if the data is a first value.

* * * * *